United States Patent [19]

Fischer

[11] Patent Number: 5,436,603

[45] Date of Patent: Jul. 25, 1995

[54] TRANSVERSE ELECTROMAGNETIC CELL

[75] Inventor: Joseph F. Fischer, Manhattan Beach, Calif.

[73] Assignee: Fischer Custom Communications, Inc., Hawthorne, Calif.

[21] Appl. No.: 127,688

[22] Filed: Sep. 27, 1993

[51] Int. Cl.⁶ .......................... H01P 1/00; H01P 3/06
[52] U.S. Cl. ..................................... 333/243; 333/34; 324/627
[58] Field of Search ................ 333/22 R, 34, 35, 243, 333/244; 324/627, 628, 632; 342/1, 4

[56] References Cited

U.S. PATENT DOCUMENTS

| | | | |
|---|---|---|---|
| 4,267,531 | 5/1981 | Spinner et al. | 333/22 R |
| 4,539,528 | 9/1985 | Bayraktaroglu et al. | 333/34 X |
| 4,837,581 | 6/1969 | Hansen et al. | 333/22 R X |
| 5,142,253 | 8/1992 | Mallavarpu et al. | 333/33 X |

OTHER PUBLICATIONS

Hall, *Impedance Matching By Tapered OR Stepped Transmission Lines,* Microwave Journal, Mar. 1966, pp. 109–114.

*Primary Examiner*—Paul Gensler
*Attorney, Agent, or Firm*—Ladas & Parry

[57] ABSTRACT

A TEM mode cell having an internal TEM element and at least one port on the cell, the cell comprising a stepped transmission line transformer coupling the internal TEM element to the port. The stepped transmission line transformer of the TEM mode cell has transfer characteristics selected to give maximum cancellation of VSWR in the cell and thereby enable optimum cell bandwidth. The TEM mode test cell comprises a hollow metallic housing having an enlarged center section with opposite open ends, and a pair of end sections, each end section closing off a respective one of the center section open ends and tapering to a distal end of reduced cross sectional area. A connector is provided at the distal end of each end section, and a stepped septum is mounted within the housing and insulated therefrom, the septum coupled to and extending between the connectors.

7 Claims, 3 Drawing Sheets

TRANSVERSE ELECTROMAGNETIC CELL

BACKGROUND OF THE INVENTION

1. Field of the Invention

This invention relates to an apparatus for improving the performance of a TEM test cell, and more particularly to an improvement in TEM mode test cells to achieve optimum bandwidth of the cell.

2. Brief Description of the Prior Art

TEM mode test chambers or cells are known in the art. Such cells consist of a section of rectangular transmission line, operating in the transverse electromagnetic mode (TEM). The cell has tapered ends leading to a transition section that includes standard coaxial connectors defining input and output ports for the cell. Although typically a TEM cell has input and output ports, it may be useful, with proper internal loading, to provide only one connector port. The object of the design of TEM test chambers is to create a uniform electromagnetic field within the cell so as to effect measurements within ±1 dB, while maintaining 50 ohm impedance at both ends of the cell.

Each cell is equipped with at least one hinged access door that provides clearance for objects up to the maximum size appropriate for each cell. Additional access openings may be provided for installation of test probes, connectors, and the like.

As background material for the type of TEM test cell to which the present invention pertains, reference is made to a U.S. Department of Commerce, National Bureau of Standards publication, NBS Technical Note 1013 entitled "Using a TEM Cell for EMC Measurements of Electronic Equipment", published April 1979 and authored by M. L. Crawford and J. L. Workman. The technical note may be ordered from the Superintendent of Documents, U.S. Government Printing Office, Washington, D.C., 20402, SD Stock No. SN003-003-02053-2, such publication incorporated herein by reference.

In the aforementioned NBS publication, procedures are given for using a TEM cell for performing either standard radiated electromagnetic (EM) susceptibility testing or for measuring radiated EM emissions from electronic/electromechanical equipment. The present invention is useful for both types of operation.

TEM cells have shown great potential for performing electromagnetic interference/electromagnetic compatibility (EMI/EMC) measurements with ease, versatility, and accuracy. The TEM cell consists of a section of rectangular, coaxially line that serves as a broadband, linear phase and amplitude transducer (in the sense that it converts field strength to rf voltage or rf voltage to field strength) either to establish standard EM fields for susceptibility testing of electronic equipment or for detecting radiated emanations from electronic equipment. The cell is bounded by a shielded metallic enclosure or housing, thus providing electrical isolation for the tests being performed.

In the center of a TEM cell is a conductor, formed of a flat sheet of metal supported by dielectric rods in the center of the cell. Access to the cell is by hinged doors located at the sides of the cell.

The center conductor, referred to in the field as a septum, is required to have a specific geometry and spacing from the shielded housing enclosure in order to generate the TEM wave in the center of the cell. In order to place the objects under evaluation inside the cell, it is desirable to have the center section of the septum and shielded housing as large as possible.

It has been found that in order to generate a reasonably uniform field at the center of the septum, the minimum lateral width of the septum and the dimensions of the shielded enclosure are such that the characteristic impedance at the center of the septum must be maintained at 50 ohms. Since the electrical connectors attached to the ports of the cell typically have a characteristic impedance of 50 ohms, it is necessary to employ some means of maintaining the 50 ohm impedance along the entire length of the cell.

In the past, the method of achieving a low VSWR has been accomplished by providing a triangular shaped or linearly tapered end sections of the septum, narrowing toward the connector ports. Since the shielded housing enclosure also tapers toward the connector ports, it will be appreciated that maintaining a perfectly matched 50 ohm characteristic impedance during the transition is difficult. In order to make the smoothest transition between the 50 ohm cables attached to the connector ports and the septum, the prior art has also provided a lumped termination network having equivalent inductance and capacitance characteristics at the high frequencies of concern to make the impedance match at the septum/connector transition, thereby defining a termination network at the ports of the cell.

Examples of such prior art technology are the IFI Crawford Cell TEM Test Chambers, models CC-103 and BC-110 manufactured by Instruments For Industry, Inc., 731 Union Parkway, Ronkonkoma, N.Y., 11779.

As further background information, a TEM mode wave is characterized by orthogonal electric and magnetic fields which are perpendicular to the direction of propagation along the length of the cell or transmission line. The electric and magnetic field components are very uniform over approximately one third the volume between the septum and the outer wall of the cell. The field simulates the planar field generated in free space with an impedance of approximately 50 ohms.

The TEM mode has no low frequency cutoff. This allows the cell to be used at frequencies as low as desired. The TEM mode has linear phase and constant amplitude response as a function of frequency. This makes it possible to use the cell to generate or detect a known field intensity. The upper useful frequency for a cell, however, is limited by distortion of the test signal caused by resonances and multi-moding that occur within the cell. These effects are a function of the physical size of the cell and its components.

The electrical characteristics of a cell as a transmission line can be determined by measuring the voltage standing wave ratio (VSWR) at the cell's measurement ports, and measuring its insertion loss.

The field generated inside the cell can be calculated by:

$$E = V/B$$

Where:
E = field generated in volts/meter
B = separation between the center plate (septum) and the outer wall
V = voltage measured at the output port.

The TEM field can be produced with an accuracy of ±1 dB up to a frequency where the higher order modes are generated within the cell. The first resonance is demonstrated by a high VSWR over a narrow frequency range. The high Q of the cell is responsible for such high VSWR.

Insertion loss is measured by comparing the ratio of the power at the output port compared to the power at the input port of the cell.

As previously noted, the normal technique for impedance matching to lower the cells VSWR is to introduce conjugate impedance matching elements at the input and output ports of the cell. While effective, these techniques can create higher order modes in the near vicinity of the input and output ports which limit the bandwidth of the cell. While prior art devices, making use of a linear taper of the ends of the septum, have successfully reduced the VSWR within the cell, the lumped impedance matching elements at the ports create extreme distortions in field structure, resulting in a less uniform field where it is desired, i.e. at the center of the cell.

There is therefore a need in the art for an improved impedance matching arrangement which accomplishes the objective of lowering the VSWR while not having an adverse effect on the electromagnetic field in the center of a cell. The present invention accomplishes that goal.

SUMMARY OF THE INVENTION

The present invention overcomes the difficulties of prior art described above, satisfying the desire for providing a uniform electromagnetic field in the center of the test cell while appropriately matching the characteristic impedance of the septum to the 50 ohm port connectors. The present invention accomplishes this goal by providing a TEM mode cell having an internal TEM element and at least one port on the cell, the cell comprising a stepped transmission line transformer coupling said internal TEM element to the port.

The stepped transmission line transformer of the TEM mode cell has transfer characteristics selected to give maximum cancellation of VSWR in the cell and thereby enable optimum cell bandwidth.

In a preferred embodiment of the invention, the TEM mode test cell comprises a hollow metallic housing having an enlarged center section with opposite open ends, and a pair of end sections, each end section closing off a respective one of the center section open ends and tapering to a distal end of reduced cross sectional area. A connector is provided at the distal end of each end section, and a stepped septum is mounted within the housing and insulated therefrom, the septum coupled to and extending between the connectors.

The septum has a central portion joining a pair of end portions, each end portion having a stepped contour and reducing in size toward its associated connector. At the high frequencies of operation of a TEM mode test chamber, the tapered end of the septum is the equivalent, at low frequencies, of a transformer. By providing multiple steps in the transition region between the port connectors and the center of the septum, a stepped transmission line transformer coupling is provided. Unexpectedly, this stepped transmission line transformer arrangement, in addition to providing a smooth impedance match coupling between the septum and the port connectors, improves the uniformity of the field in the center of the septum. That is, the stepped transmission line transformer effect unexpectedly reduces the VSWR resulting in a more uniform field with smoother transitions in the coupling to the port connectors, and with the reduction of VSWR, the bandwidth of the cell is extended to a higher frequency range than that which would be expected with the same physical characteristics of the septum and housing without a stepped contour in the generally tapered end portions of the septum.

As mentioned previously, lumped elements at the termination of the septum at the connector ports according to the prior art creates extreme disturbances in field structure, even when the septum is tapered linearly in order to reduce the VSWR.

BRIEF DESCRIPTION OF THE DRAWING

The invention will now be described with reference to the accompanying drawings in which.

DETAILED DESCRIPTION OF THE PREFERRED EMBODIMENTS

Figure 1:
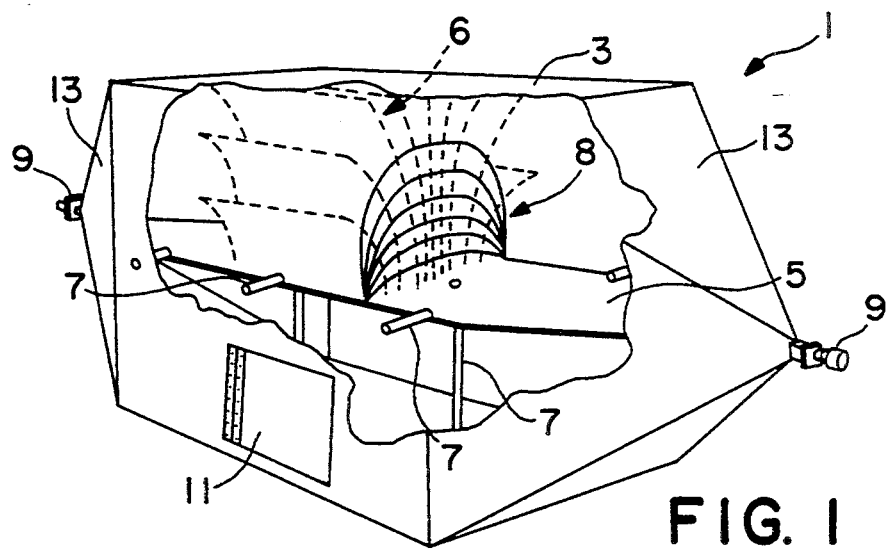
FIG. 1 is a partial cutaway perspective view of a prior art TEM mode test cell or chamber.

FIG. 1 shows a typical prior art TEM mode test cell 1 with a portion of the outer housing 3 cutaway to show the internal septum 5 and the representation of the electric and magnetic fields 6, 8 generated or imposed upon the center of the septum 5.

The septum 5 is insulated from the housing 3 by means of a plurality of insulator elements 7. The port connectors 9 at each end of test cell 1 are shown attached to the narrowed end of the tapered end portions 13 of housing 3. For access into the interior of test cell 1, a hinged door 11, or a plurality of such doors, is provided, appropriately designed for permitting cables to be run into and out of the interior of the test cell.

Figure 2:
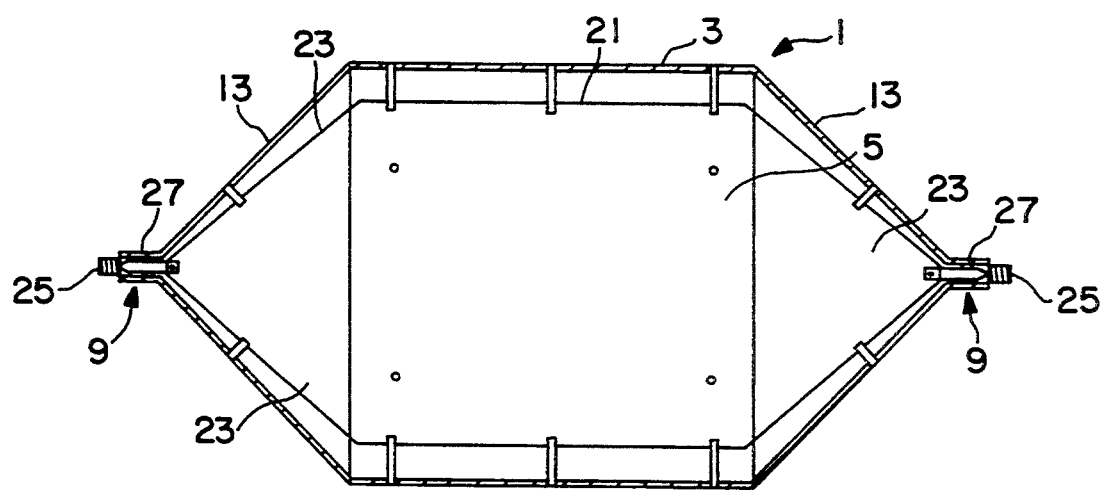
FIG. 2 is a top cross sectional view of the prior art TEM mode test chamber of FIG. 1.

FIG. 2 is a partial cross sectional top view of the test cell 1 in which the insulatively supported septum 5 is shown according to a prior art construction. As will be observed, the septum 5 has a rectangular planar central portion 21 and linearly tapered planar end portions 23 leading to the end connector port terminals 9, shown in FIG. 2 to be provided with a threaded end 25 for direct connection to a coaxial cable in a manner known in the prior art. The outer tapering portion 13 of the housing 3, shown at 13, narrows down to a tubular nose portion 27 which physically mounts the terminal 9.

Figure 3:
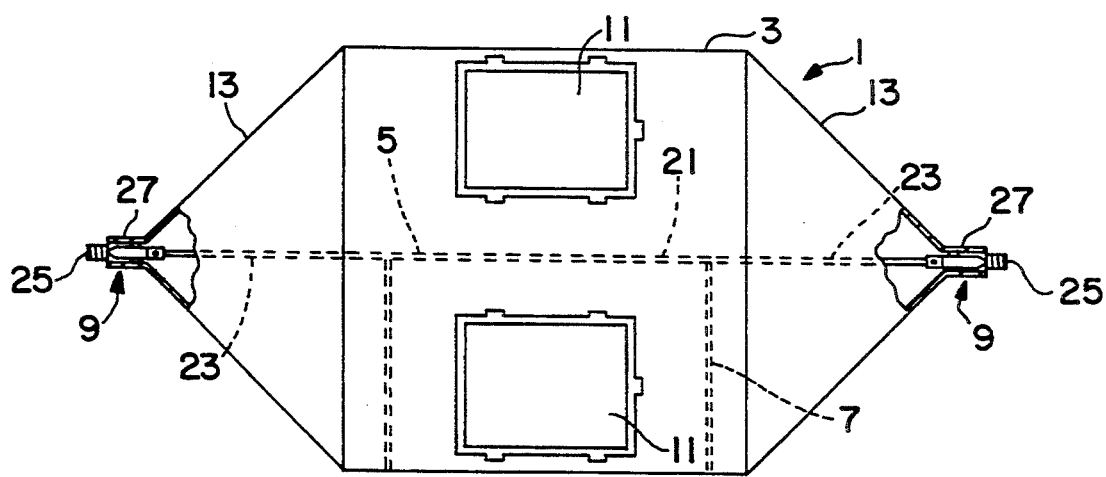
FIG. 3 is a side elevation view of the TEM mode test chamber of FIG. 1.

In FIG. 3, the prior art TEM mode test chamber 1 is shown in a side view with the septum 5 shown in phantom. As is typical in such prior art test chambers, the septum 5 is a flat plate-like element of brass and is supported in all directions by a number of dielectric insulators 7.

Figure 4:
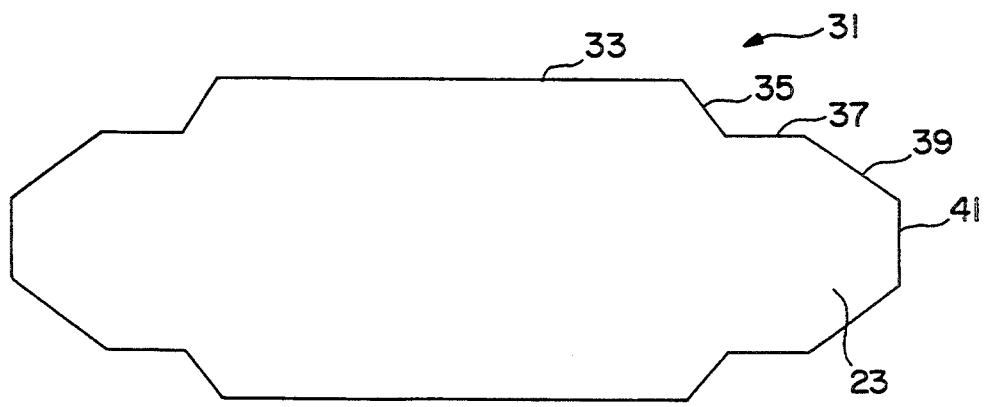
FIG. 4 is a plan view of the septum according to the present invention showing a stepped contour on each end portion of the septum.
Figure 5:
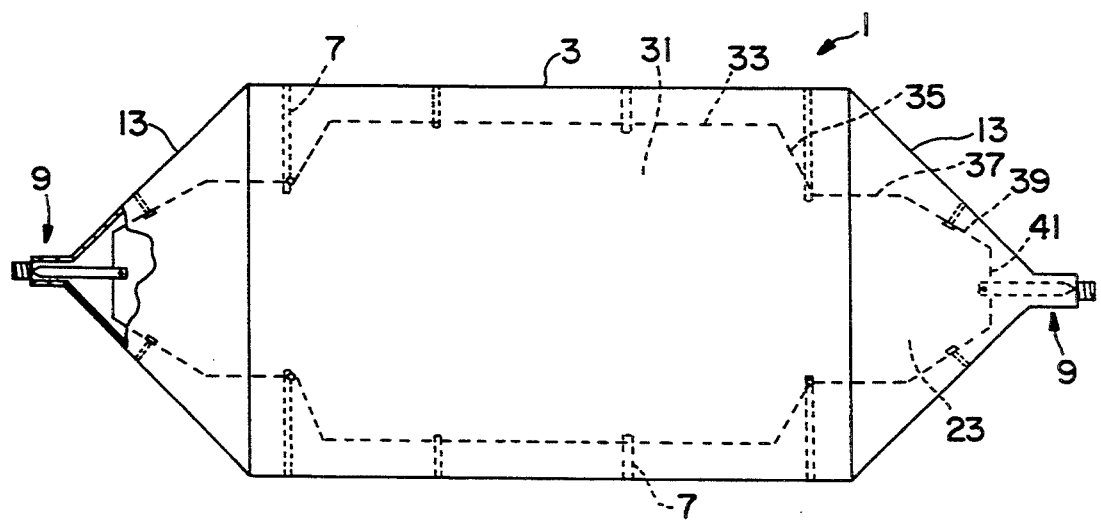
FIG. 5 is a top view of a TEM mode test chamber in which the septum according to FIG. 4 is shown in dashed lines.

As alluded to earlier, the improvement according to the present invention resides in the contour of the tapered end portions of the septum, and this is clearly illustrated in FIG. 4 and described in the description which follows.

Although the septum 31 shown in FIG. 4 illustrates two steps in the end portion, there is no limit to the number of steps that can be provided, although two is adequate for accomplishing the stated purpose of the invention, i.e. to provide a 50 ohm termination to the port connectors 9 at one end (the narrowed end) and an appropriate characteristic impedance coupling to the center portion 33 of septum 31 at the other end of the end portion 23 of septum 31, while maintaining a uniform electromagnetic field over a large volume at the center of the septum 31.

In a preferred embodiment, the ratio of the cross sectional dimension across the middle step portion 37 at each septum end portion 23 relative to the cross sectional dimension of the smallest end 41 is approximately 2.7 to 1. The ratio of the axial length of the transition 39 between the smallest end 41 and the middle step 37 relative to the cross sectional dimension of the smallest end 41 is approximately 1.2 to 1. The ratio of the axial length of the transition 35 between the middle step 37 and the septum central portion 33 relative to the cross sectional dimension of the smallest end 41 is approximately 0.5 to 1. The cross sectional dimension of each septum end portion 23 at its smallest end 41 is approximately one fourth the cross sectional dimension of the central portion of the septum.

The dimensions of the length of each step, the angle of the transition portion between each step, the width of the septum, and other characteristics of the contour at the end portion of the septum can be mathematically calculated. However, at extremely high frequencies at which the TEM mode test chamber may be used, as opposed to attempting to account for all possible distributed impedances affecting a mathematical calculation, it is generally preferred to derive the physical characteristics of the septum design, i.e. the stepped structure at the end portions of the septum, by empirical methods. With modern electronic test components, a series of different frequency test signals can be applied at one end of the test chamber, and by using a spectrum analyzer to determine the characteristics of the field distribution within the test cell, minor adjustments in the design of the septum can be quickly evaluated, and an optimum design configuration can be easily arrived at in less time than entering all of the possible factors that could affect a mathematical calculation to produce the same results, and, of course, the empirical data is much more reliable insofar as accounting for all distributed capacitances and inductances in the system which might be overlooked by a mathematical calculation or misjudged as to the effect of such distribution elements.

Figure 6:
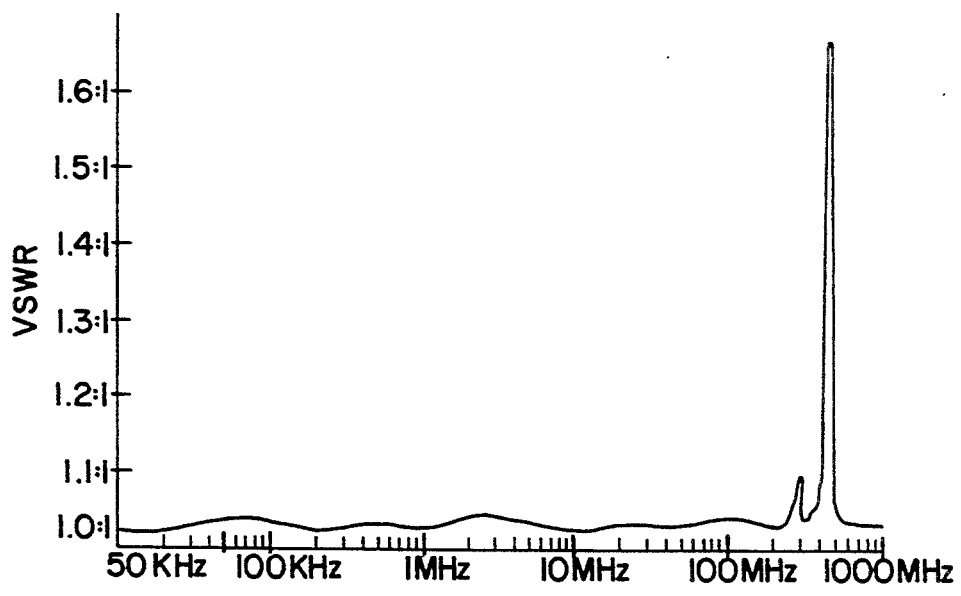
FIG. 6 is a VSWR vs. frequency graph of a typical prior art TEM mode test chamber.

As indicated earlier, the stepped septum design of the present invention, creating a stepped transmission line transformer coupling between the center of the septum and the connecting ports reduces VSWR within the test cell. FIG. 6 shows the results of testing a prior art TEM mode test cell plotting VSWR vs. frequency. As will be observed, a first mode VSWR spike is shown at approximately 475 MHz, and a smaller VSWR perturbation is shown at approximately 300 MHz. VSWRs of 1.2 to 1 are considered to be characteristic of a good TEM cell design. In the prior art test cell results shown in FIG. 6, therefore, it can be appreciated that the cell can only be used for test procedures requiring frequencies to be less than approximately 400 MHz.

Figure 7:
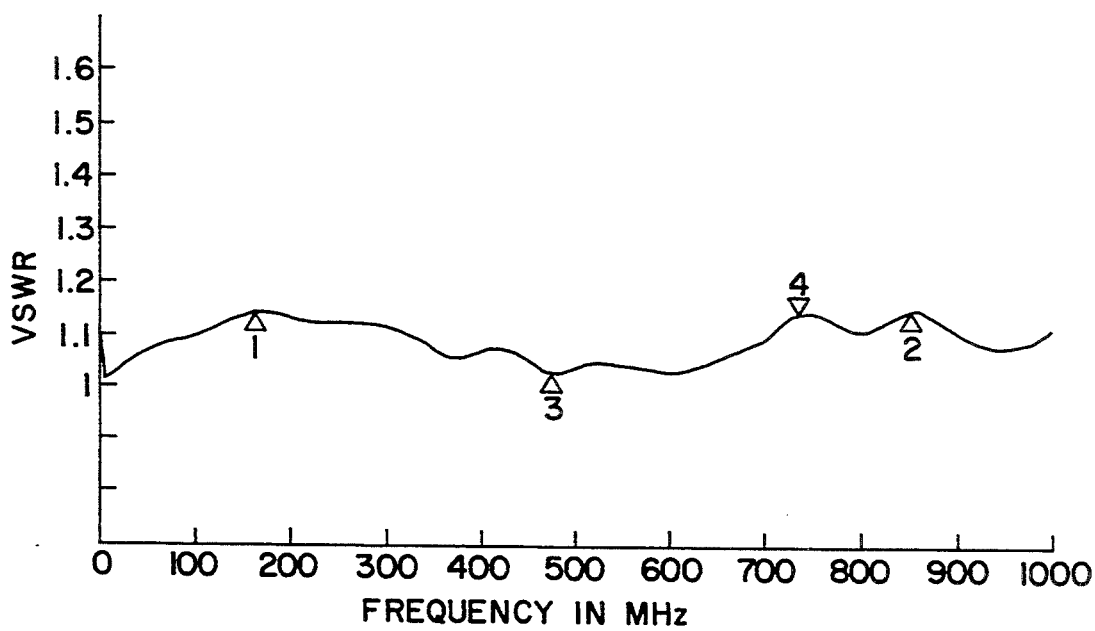
FIG. 7 is a VSWR vs. frequency graphical representation of the characteristics of a TEM mode test chamber made in accordance with the present invention.

The graph of FIG. 7 shows the results of a physically similar physical TEM mode test cell, but with the septum design made in accordance with the present invention installed. Here, it will be observed that there is no high amplitude VSWR occurrence within the entire frequency range up to 1,000 MHz, and the VSWR is maintained at less than 1.15 to 1 throughout the same frequency range.

The graphical results shown in both FIGS. 6 and 7 assume that appropriate absorption techniques have been used in accordance with the known prior art methods to reduce internal reflections and the VSWR as low as possible within the test cell. In the comparison between FIGS. 6 and 7, the only difference between the prior art cell and the cell made in accordance with the present invention is the replacement of a linearly tapered septum (with its lumped termination network) by a stepped septum, and the results demonstrate the superiority of a stepped septum configuration.

The present invention has been described with particular reference to the specific embodiment shown in the figures, especially FIG. 4, in which the end portion of the septum is shown to have two steps defining the transmission line termination transformer effect. It will be obvious to those skilled in the art that variations in the number of steps, the slope of the transitions between steps, and the length of each step might be altered under highly controlled empirical testing procedures to result in a more optimum design than that shown in FIG. 4. Accordingly, it is to be understood that the design of the septum shown in FIG. 4 and described in particularity in this description is simply an example of the concept of the invention, and designs of other septum arrangements with different numbers of steps and different configurations or dimensions are considered to be within the scope of the present invention. The selection of the number of steps and the geometrical configuration of the septum end sections are based on accomplishing a low profile VSWR vs. frequency relationship. Thus, all that is necessary is to design a stepped septum such that the signal amplitude and phase relationships at the steps result in a lowering of the VSWR. Relatively straightforward laboratory empirical testing can be employed to find the optimum geometry for each application. Accordingly, the invention is to be limited only by the scope of the claims.

I claim:

1. A TEM mode test cell, comprising:
    a hollow metallic housing having an enlarged center section with opposite open ends, and a pair of end sections, each end section closing off a respective one of said center section open ends and tapering to a distal end of reduced cross sectional area;
    a connector at each end section distal end; and
    a septum mounted within said housing and insulated therefrom, said septum coupled to and extending between said connectors and having a central portion joining a pair of end portions, each said end portion having a stepped contour and reducing in size toward its associated connector, wherein each said septum end portion has at least two steps in its contour, the slope of the transitions between steps being greatest leading to said septum central portion and being the least leading to its associated connector.

2. The test cell as claimed in claim 1, wherein the cross sectional dimension of each said septum end portion at its smallest end is approximately one fourth the cross sectional dimension of said septum central portion.

3. The test cell as claimed in claim 2, wherein each septum end portion is stepped twice, and the ratio of the cross sectional dimension at the middle step of each said septum end portion relative to the cross sectional dimension of said smallest end is approximately 2.7 to 1.

4. The test cell as claimed in claim 3, wherein the ratio of the axial length of the transition between said smallest end and said middle step relative to the cross sectional dimension of said smallest end is approximately 1.2 to 1.

5. The test cell as claimed in claim 3, wherein the ratio of the axial length of the transition between said middle step and said septum central portion relative to the cross sectional dimension of said smallest end is approximately 0.5 to 1.

6. The TEM mode test cell as claimed in claim 1, wherein:
 the length of each step, the cross sectional dimension at each step, and the slope of each transition between steps are predetermined to minimize voltage standing wave ratio (VSWR) within said cell.

7. The TEM mode test cell as claimed in claim 6, wherein said predetermined lengths, dimensions, and slopes are determined empirically.

* * * * *